United States Patent
Lee et al.

(10) Patent No.: US 9,147,595 B2
(45) Date of Patent: Sep. 29, 2015

(54) SEMICONDUCTOR DEVICES HAVING BURIED METAL SILICIDE LAYERS AND METHODS OF FABRICATING THE SAME

(71) Applicant: SK hynix Inc., Icheon (KR)

(72) Inventors: Sang Do Lee, Seoul (KR); Hae Jung Lee, Seoul (KR); Myoung Soo Kim, Seongnam (KR); Sang Kil Kang, Gwangju (KR)

(73) Assignee: SK HYNIX INC., Icheon (KR)

( * ) Notice: Subject to any disclaimer, the term of this patent is extended or adjusted under 35 U.S.C. 154(b) by 45 days.

(21) Appl. No.: 13/842,049

(22) Filed: Mar. 15, 2013

(65) Prior Publication Data

US 2014/0175555 A1    Jun. 26, 2014

(30) Foreign Application Priority Data

Dec. 24, 2012 (KR) .................. 10-2012-0151669

(51) Int. Cl.
*H01L 21/764* (2006.01)
*H01L 21/762* (2006.01)
*H01L 27/108* (2006.01)

(52) U.S. Cl.
CPC ...... *H01L 21/76224* (2013.01); *H01L 27/10805* (2013.01); *H01L 27/10873* (2013.01); *H01L 27/10885* (2013.01); *H01L 27/10891* (2013.01)

(58) Field of Classification Search
CPC ................. H01L 21/76224; H01L 27/10885
USPC ........................... 257/368; 438/424
See application file for complete search history.

(56) References Cited

U.S. PATENT DOCUMENTS

2011/0215396 A1* 9/2011 Tang et al. ............. 257/329
2013/0234230 A1* 9/2013 Takesako et al. ........ 257/324

FOREIGN PATENT DOCUMENTS

KR         10-1116360 A     2/2012

* cited by examiner

*Primary Examiner* — Cheung Lee
*Assistant Examiner* — Stephen Bradley

(57) ABSTRACT

A semiconductor device includes a substrate and a plurality of active pillars disposed on the substrate and spaced apart from each other by trenches. Each of the active pillars includes a buried metal silicide pattern and an active region stacked on the buried metal silicide pattern, and the active region includes impurity junction regions.

5 Claims, 13 Drawing Sheets

SEMICONDUCTOR DEVICES HAVING BURIED METAL SILICIDE LAYERS AND METHODS OF FABRICATING THE SAME

CROSS-REFERENCE TO RELATED APPLICATION

The present application claims priority under 35 U.S.C 119(a) to Korean Application No. 10-2012-0151669, filed on Dec. 24, 2012, in the Korean intellectual property Office, which is incorporated herein by reference in its entirety as set forth in full.

BACKGROUND

Embodiments of the present disclosure relate to semiconductor devices and methods of fabricating the same and, more particularly, to semiconductor devices having buried metal silicide layers and methods of fabricating the same.

As digital home appliances become smaller in size and mobile systems become wide-spread, semiconductor devices employed in the digital home appliances and the mobile systems have been continuously scaled down. Attempts to increase the device integration density in dynamic random access memory (DRAM) devices or flash memory devices including memory cells have typically resulted in the reduction of areas (planar areas) that the memory cells occupy. In general, a unit memory cell of the DRAM devices includes a cell transistor and a cell capacitor. The DRAM cell transistors may be formed in and/or on a semiconductor substrate and the DRAM cell capacitors may be stacked on the DRAM cell transistors to increase the integration density of the DRAM devices.

The DRAM cell transistors may be electrically connected to the DRAM cell capacitors through storage node contact plugs which are disposed between source regions of the DRAM cell transistors and bottom electrodes of the DRAM cell capacitors. Further, drain regions of the DRAM cell transistors may be electrically connected to bit lines through bit line contact plugs, and gate electrodes of the DRAM cell transistors may be electrically connected to word lines. Therefore, the bit lines and the word lines for transmitting electric signals may be disposed between the DRAM cell transistors and the DRAM cell capacitors. Thus, there may be some limitations in increasing the cell capacitance due to the presence of the bit lines and the word lines. Moreover, most of the DRAM cell transistors may be formed to have a planar configuration. In such a case, if a width of the word lines is reduced to increase the integration density of the DRAM devices, electrical resistance of the word lines may increase. As a result, RC delay time of the word lines may increase to degrade the performance of the DRAM devices. In addition, if the planar type cell transistors are scaled down, leakage current of the planar type cell transistors may abruptly increase to degrade the cell characteristics of the DRAM devices. Accordingly, vertical transistors have been proposed to solve or overcome the disadvantages of the planar transistors.

SUMMARY

Various embodiments are directed to semiconductor devices having buried metal silicide layers and methods of fabricating the same.

According to some embodiments, a semiconductor device includes a substrate and a plurality of active pillars disposed on the substrate to be spaced apart from each other by trenches. Each of the active pillars includes a buried metal silicide pattern and an active region stacked on the buried metal silicide pattern, and the active region includes impurity junction regions therein.

In some embodiments, the semiconductor device may further include a partial filling insulation layer disposed in the trenches. The partial filing insulation layer may be disposed between a bottom surface level of the trenches and a first height level located at the same level as bottom surfaces of the metal silicide patterns. The partial filing insulation layer may include a silicon oxide layer.

In some embodiments, the semiconductor device may further include capping insulation patterns disposed on respective ones of the active pillars. The capping insulation patterns may include a silicon nitride layer. The semiconductor device may further include spacers disposed on respective ones of sidewalls of the capping insulation patterns. The spacers may extend onto sidewalls of the active regions under the capping insulation patterns. The spacers may include a silicon oxide layer.

In some embodiments, the buried metal silicide patterns may include a cobalt silicide layer.

In some embodiments, the impurity junction regions in the active region may include an upper impurity region disposed in an upper portion of the active region and a lower impurity region disposed in a lower portion of the active region.

According to further embodiments, a semiconductor device includes a plurality of active pillars disposed on a substrate to be spaced apart from each other by first trenches and second trenches which are alternately arrayed. Each of the active pillars includes a buried metal silicide pattern and an active region which are sequentially stacked. The first trenches are filled with a full filling insulation layer. A partial filling insulation layer is disposed in the second trenches. The partial filling insulation layer is disposed between a bottom surface level of the second trenches and a first height level located at the same level as bottom surfaces of the buried metal silicide patterns. Spacers are disposed on respective ones of sidewalls of the active regions in the second trenches. The active region includes impurity junction regions therein.

In some embodiments, the semiconductor device may further include capping insulation patterns on respective ones of the active pillars.

In some embodiments, the buried metal silicide patterns may include a cobalt silicide layer.

According to further embodiments, a semiconductor device includes a plurality of active pillars disposed on a substrate to be spaced apart from each other by trenches. Each of the active pillars includes a buried metal silicide pattern and an active region which are sequentially stacked. A partial filling insulation layer is disposed in the trenches. The partial filling insulation layer is disposed between a bottom surface level of the trenches and a predetermined height level on the bottom surface level. Insulation patterns are disposed in respective ones of the trenches to provide air gaps between sidewalls of the buried metal silicide patterns. The sidewalls of the metal silicide patterns are exposed to the air gaps, and each of the active regions includes impurity junction regions therein.

According to further embodiments, a semiconductor device includes a plurality of active pillars disposed on a substrate to be spaced apart from each other by first trenches and second trenches which are alternately arrayed. Each of the active pillars includes a buried metal silicide pattern and an active region which are sequentially stacked. A full filling insulation layer fills the first trenches. A partial filling insulation layer is disposed in the second trenches. The partial filling insulation layer is disposed between a bottom surface level of the second trenches and a first height level located at the same level as bottom surfaces of the buried metal silicide patterns. Insulation patterns are disposed in respective ones of the second trenches to provide air gaps between sidewalls of the buried metal silicide patterns in the second trenches. The active region includes impurity junction regions therein.

According to further embodiments, a method of fabricating a semiconductor device includes forming trenches in a substrate to define a plurality of active pillars spaced apart from each other by the trenches, forming a partial filling insulation layer which fills lower regions in the trenches, forming a first sacrificial layer in the trenches on the partial filling insulation layer, forming spacers on respective ones of sidewalls of the active pillars exposed by the trenches on the first sacrificial layer, removing the first sacrificial layer to expose sidewalls of the active pillars between a top surface of the partial filling insulation layer and bottom surfaces of the spacers, forming a metal layer contacting the exposed sidewalls of the active pillars, applying a silicidation process to the substrate including the metal layer to form metal silicide patterns in respective ones of the active pillars, and removing the metal layer remaining in the trenches.

In some embodiments, the partial filling insulation layer may be formed to be in direct contact with bottom surfaces and lower sidewalls of the trenches.

In some embodiments, the partial filling insulation layer may be formed of a silicon oxide layer and the first sacrificial layer may be formed of a carbon layer or a photoresist layer.

In some embodiments, the method may further include forming a second sacrificial layer in the trenches between the metal silicide patterns, forming insulation patterns in respective ones of the trenches to cover the second sacrificial layer, and removing the second sacrificial layer to form air gaps in the trenches between the metal silicide patterns.

According to further embodiments, a method of fabricating a semiconductor device includes forming first trenches and second trenches in a substrate to define a plurality of active pillars spaced apart from each other by the first and second trenches, forming a full filling insulation layer which fills the first and second trenches, selectively recessing the full filling insulation layer in the second trenches to form a partial filling insulation layer, forming a first sacrificial layer in the second trenches on the partial filling insulation layer, forming spacers on respective ones of sidewalls of the active pillars exposed by the second trenches on the first sacrificial layer, removing the first sacrificial layer to expose sidewalls of the active pillars between a top surface of the partial filling insulation layer in the second trenches and bottom surfaces of the spacers in the second trenches, forming a metal layer contacting the exposed sidewalls of the active pillars, applying a silicidation process to the substrate including the metal layer to form metal silicide patterns in respective ones of the active pillars, and removing the metal layer remaining after the silicidation process. The first trenches and the second trenches are alternately arrayed.

In some embodiments, selectively recessing the full filling insulation layer in the second trenches may be performed using a mask pattern that covers the full filling insulation layer in the first trenches and exposes the full filling insulation layer in the second trenches. The mask pattern may be formed of a polysilicon layer.

In some embodiments, the partial filling insulation layer may be formed to be in direct contact with bottom surfaces and lower sidewalls of the second trenches.

In some embodiments, the partial filling insulation layer may be formed of a silicon oxide layer and the first sacrificial layer may be formed of a carbon layer or a photoresist layer.

In some embodiments, the method may further include forming a second sacrificial layer in the second trenches between the metal silicide patterns, forming insulation patterns in respective ones of the second trenches to cover the second sacrificial layer, and removing the second sacrificial layer to form air gaps in the second trenches between the metal silicide patterns.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Figure 1:
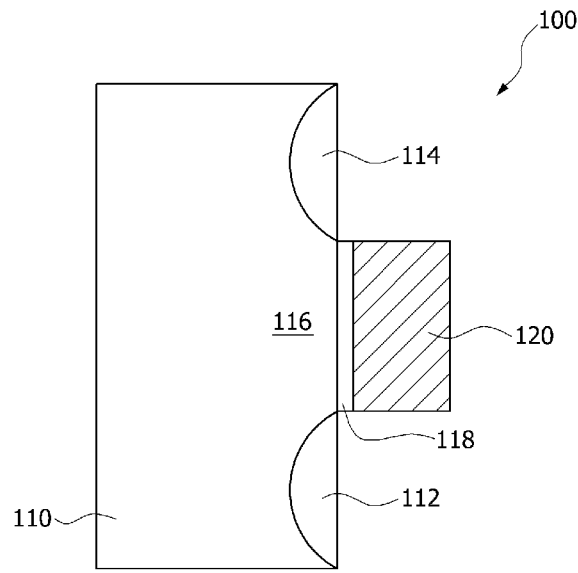
FIG. 1 is a cross sectional view illustrating a general vertical transistor.

FIG. 1 is a cross sectional view illustrating a general vertical transistor. As illustrated in FIG. 1, a vertical transistor 100 may be configured to include a drain region 112 disposed in a lower sidewall of a semiconductor substrate 110 and a source region 114 disposed in an upper sidewall of a semiconductor substrate 110. A channel region 116 may be defined along a vertical direction between the drain region 112 and the source region 114, and a gate insulation layer 118 and a gate electrode 120 may be sequentially stacked on a sidewall surface of the channel region 116. If the vertical transistor 100 is employed as a cell transistor of a DRAM device, the drain region 112 may be electrically connected to a bit line and the source region 114 may be electrically connected to a storage node of a cell capacitor.

In such a case, the bit line may be buried in a lower portion of the semiconductor substrate 110. Thus, the storage node may be freely disposed on the vertical transistor 100 without restriction of the bit line. That is, even though the integration density of the DRAM device increases, use of the vertical transistor 100 may prevent the cell capacitance of the DRAM device from being reduced. Further, since the bit line is buried in the semiconductor substrate 110, the parasitic capacitance of the bit line may be reduced and the height of the storage node may also be reduced without degradation of the cell capacitor.

In order to fabricate the vertical transistor 100, a side junction region, for example, the drain region 112, is formed in a lower sidewall of the semiconductor substrate 110. To form the drain region 112, a side contact opening process may be performed to expose the lower sidewall of the semiconductor substrate 110. The side contact opening process may be performed using various techniques. For example, one of the side contact opening processes is taught in US patent publication No. 2012/0208364 A1 to Rouh et al., entitled "Method for Opening One-side Contact Region of Vertical Transistor and Method for Fabricating One-side Junction Region Using the Same".

Figure 2:
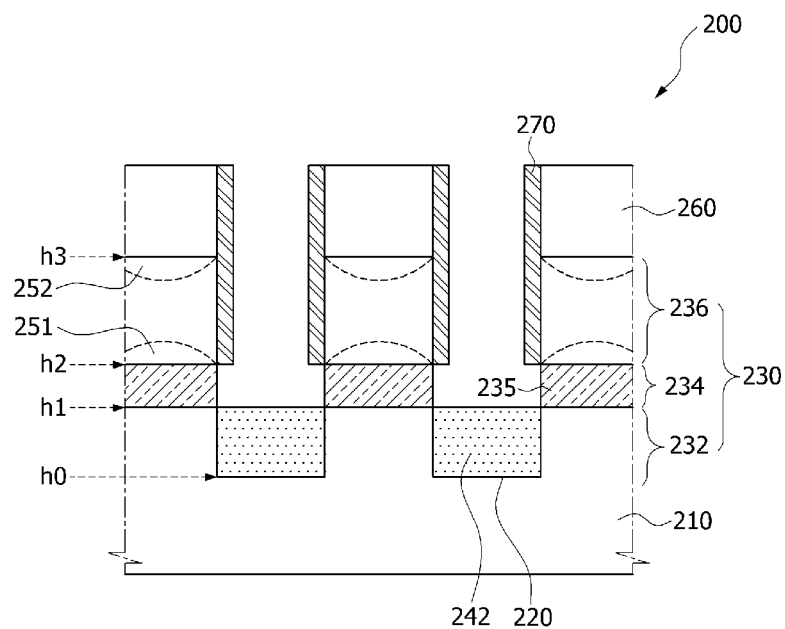
FIG. 2 is a cross sectional view illustrating a semiconductor device according to an embodiment.

FIG. 2 is a cross sectional view illustrating a semiconductor device according to an embodiment. Referring to FIG. 2, a semiconductor device 200 according to an embodiment may include a plurality of active pillars 230 disposed on a substrate 210 and uniformly spaced apart from each other by trenches 220. The substrate 210 may include a silicon substrate, but embodiments are not limited thereto. In some embodiments, the active pillars 230 may extend from the substrate 210. That is, the active pillars 230 and the substrate 210 may constitute a single unified body without any heterogeneous junction therebetween. In such a case, a pitch size and a height of the active pillars 230 may be defined by the trenches 220 which are formed by partially removing the substrate 210.

The trenches 220 may have a uniform dimension, and the active pillars 230 may also have a uniform dimension. For example, a depth of the trenches 220 corresponding to a height of the active pillars 230 may be within the range of about 2200 Å to about 3200 Å, and a width of the active pillars 230 may be within the range of about 14 nm to about 18 nm. Further, a width of the trenches 220 corresponding to a space of the active pillars 230 may be within the range of about 13 nm to about 18 nm.

Lower portions in the trenches 220 between a bottom level H0 of the trenches 220 and a first height level H1 above the bottom level H0 may be filled with a partial filling insulation layer 242. In some embodiments, the partial filling insulation layer 242 may include a silicon oxide layer. As such, lowermost portions 232 of adjacent active pillars 230 may be insulated from each other by the partial filling insulation layer 242.

Portions of the active pillars 230 between the first height level H1 and a second height level H2 above the first height level H1 may correspond to metal silicide regions 234. Each of the metal silicide regions 234 may be filled with metal silicide patterns 235. In some embodiments, each of the metal silicide patterns 235 may include a cobalt silicide (CoSi) layer. The metal silicide patterns 235 may be distributed from the first height level H1 to the second height level H2 in the active pillars 230. Thus, sidewalls of the metal silicide patterns 235 may be exposed by the trenches 220.

Each of the active pillars 230 may further include a transistor active region 236 disposed on the metal silicide region 234. The transistor active region 236 may include a drain region 251 disposed in a lower portion thereof and a source region 252 disposed in an upper portion thereof. Although not indicated in the drawing, the transistor active region 236 may also include a channel region between the drain region 251 and the source region 252.

Capping insulation patterns 260 may be disposed on the active pillars 230. In some embodiments, the capping insulation patterns 260 may be silicon nitride patterns. Spacers 270 may be disposed on sidewalls of the capping insulation patterns 260 and the transistor active regions 236. In some embodiments, the spacers 270 may include a silicon oxide layer. In the semiconductor device 200 according to the present embodiment, the metal silicide patterns 235 may be used as buried bit lines.

Figure 3:
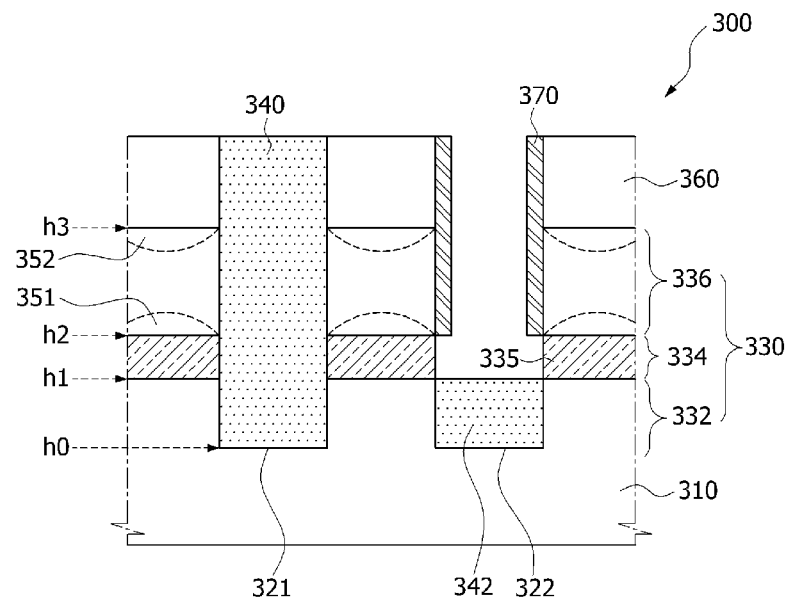
FIG. 3 is a cross sectional view illustrating a semiconductor device according to another embodiment.

FIG. 3 is a cross sectional view illustrating a semiconductor device according to another embodiment. Referring to FIG. 3, a semiconductor device 300 according to the present embodiment may include first trenches 321 and second trenches 322 which are alternately arrayed in a substrate 310. The semiconductor device 300 may further include active pillars 330 disposed between the first trenches 321 and the second trenches 322.

In some embodiments, the active pillars 330 may extend from the substrate 310. That is, the active pillars 330 and the substrate 310 may constitute a single unified body without any heterogeneous junction therebetween. In such a case, a pitch size and a height of the active pillars 330 may be defined by the first and second trenches 321 and 322 which are formed by partially removing the substrate 310.

The first and second trenches 321 and 322 may have uniform dimensions, and the active pillars 330 may also have uniform dimensions. For example, a depth of the first and second trenches 321 and 322 (corresponding to a height of the active pillars 330) may be within the range of about 2200 Å to about 3200 Å, and a width of the active pillars 330 may be within the range of about 14 nm to about 18 nm. Further, a width of the first and second trenches 321 and 322 (corresponding to a space of the active pillars 330) may be within the range of about 13 nm to about 18 nm.

The first trenches 321 may be completely filled with a full filling insulation layer 340, whereas lower portions of the second trenches 322 between a bottom level H0 of the second trenches 322 and a first height level H1 on the bottom level H0 may be filled with a partial filling insulation layer 342. The full filling insulation layer 340 and the partial filling insulation layer 342 may be the same material. In some embodiments, the full filling insulation layer 340 and the partial filling insulation layer 342 may be a silicon oxide layer.

As a result, lowermost regions 332 of the adjacent active pillars 330 may be insulated from each other by the partial filling insulation layer 342 or the full filling insulation layer 340. As described above, while the partial filling insulation layer 342 may fill only a lower portion of each of the second trenches 322, the full filling insulation layer 340 may completely fill first trenches 321. Thus, in an embodiment in which the width of the active pillars 330 is relatively low, the full filling insulation layer 340 may support the active pillars 330 to suppress a leaning phenomenon of the active pillars 330.

Portions of the active pillars 330 between the first height level H1 and a second height level H2 above the first height level H1 may correspond to metal silicide regions 334, and each of the metal silicide regions 334 may be filled with a metal silicide pattern 335. In some embodiments, each of the metal silicide patterns 335 may include a cobalt silicide (CoSi) layer. The metal silicide patterns 335 may be distributed from the first height level H1 to the second height level H2 in the active pillars 330. Thus, in embodiments, one sidewall of each metal silicide pattern 335 may be exposed by the second trench 322, and the opposite sidewall of each metal silicide pattern 335 may be in contact with the full filling insulation layer 340 filling the first trenches 321.

Each of the active pillars 330 may further include a transistor active region 336 disposed on the metal silicide region 334, and the transistor active region 336 may include a drain region 351 disposed in a lower portion thereof and a source region 352 disposed in an upper portion thereof. Although not indicated in the drawing, the transistor active region 336 may also include a channel region between the drain region 351 and the source region 352.

Capping insulation patterns 360 may be disposed on respective ones of the active pillars 330. In some embodiments, the capping insulation patterns 360 may be silicon nitride patterns. One of both sidewalls of each capping insulation pattern 360 and one of both sidewalls of each the transistor active regions 336 may be covered with a spacer 370. In some embodiments, the spacer 370 may include a silicon oxide layer. In the semiconductor device 300 according to the present embodiment of FIG. 3, the metal silicide patterns 335 may be used as buried bit lines.

Figure 4:
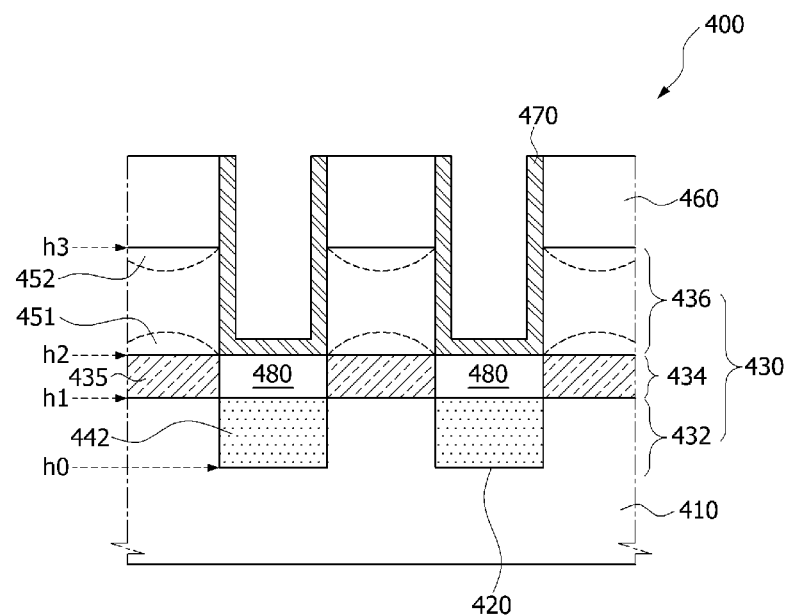
FIG. 4 is a cross sectional view illustrating a semiconductor device according to still another embodiment.

FIG. 4 is a cross sectional view illustrating a semiconductor device according to still another embodiment. Referring to FIG. 4, a semiconductor device 400 according to the present embodiment may include a plurality of active pillars 430 disposed on a substrate 410 and uniformly spaced apart from each other by trenches 420. The substrate 410 may include a silicon substrate, but embodiments are not limited thereto.

In some embodiments, the active pillars 430 may extend upward from the substrate 410. That is, the active pillars 430 and the substrate 410 may constitute a single unified body without any heterogeneous junction therebetween. In such an embodiment, a pitch size and a height of the active pillars 430 may be defined by the trenches 420 which are formed by partially removing the substrate 410.

The trenches 420 may have uniform dimensions, and the active pillars 430 may also have uniform dimensions. For example, a depth of the trenches 420 corresponding to a height of the active pillars 430 may be within the range of about 2200 Å to about 3200 Å, and a width of the active pillars 430 may be within the range of about 14 nm to about 18 nm. Further, a width of the trenches 420 corresponding to a space of the active pillars 430 may be within the range of about 13 nm to about 18 nm.

Lower portions in the trenches 420 between a bottom level H0 of the trenches 420 and a first height level H1 above the bottom level H0 may be filled with a partial filling insulation layer 442. In some embodiments, the partial filling insulation layer 442 may include a silicon oxide layer. As such, lowermost regions 432 of the adjacent active pillars 430 may be insulated from each other by the partial filling insulation layer 442.

Portions of the active pillars 430 between the first height level H1 and a second height level H2 above the first height level H1 may correspond to metal silicide regions 434. Each of the metal silicide regions 434 may be filled with metal silicide patterns 435. In some embodiments, each of the metal silicide patterns 435 may include a cobalt silicide (CoSi) layer. The metal silicide patterns 435 may be distributed from the first height level H1 to the second height level H2 in the active pillars 430. Thus, sidewalls of the metal silicide patterns 435 may be exposed by the trenches 420.

Each of the active pillars 430 may further include a transistor active region 436 disposed on the metal silicide region 434. The transistor active region 436 may include a drain region 451 disposed in a lower portion thereof and a source region 452 disposed in an upper portion thereof. Although not indicated in the drawing, the transistor active region 436 may also include a channel region between the drain region 451 and the source region 452.

Capping insulation patterns 460 may be disposed on the active pillars 430. In some embodiments, the capping insulation patterns 460 may be silicon nitride patterns.

An insulation pattern 470 having a 'U'-shaped vertical cross section may be disposed in each of the trenches 420, and a bottom surface of the 'U'-shaped insulation pattern 470 may be located at substantially the same level as the second height level H2. Thus, air gaps 480 may exist between sidewalls of the metal silicide patterns 435. Specifically, each of the insulation patterns 470 may include spacer-shaped sidewalls covering sidewalls of the adjacent transistor active regions 436 as well as sidewalls of the adjacent capping insulation patterns 460, and a base portion connecting lower ends of the spacer-shaped sidewalls to each other. Thus, the air gaps 480 may be provided between the base portions of the insulation patterns 470 and the partial filling insulation layer 442.

That is, each of the air gaps 480 may be surrounded by a top surface of the partial filling insulation layer 442, sidewalls of the pair of adjacent metal silicide patterns 435, and a bottom surface of the insulation pattern 470. Accordingly, the air gaps 480 may exist between the metal silicide patterns 435. As a result, a parasitic capacitance or a coupling capacitance between the adjacent metal silicide patterns 435 may be reduced because the air in the air gaps 480 has a lower dielectric constant than other insulation materials such as a silicon oxide material and a silicon nitride material. In some embodiments, each of the insulation patterns 470 may include a silicon oxide layer. In a semiconductor device 400 according to the present embodiment, the metal silicide patterns 435 may be used as buried bit lines.

Figure 5:
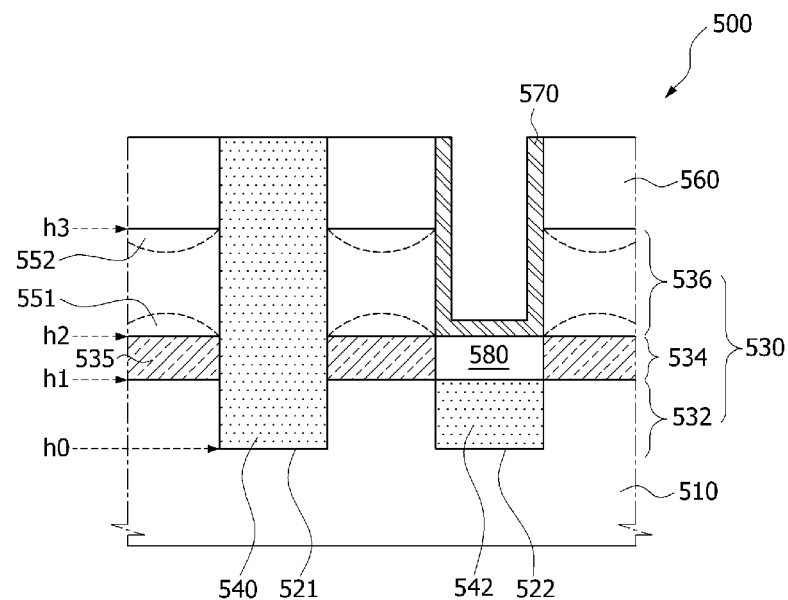
FIG. 5 is a cross sectional view illustrating a semiconductor device according to yet another embodiment.

FIG. 5 is a cross sectional view illustrating a semiconductor device according to yet another embodiment. Referring to FIG. 5, a semiconductor device 500 according to the present embodiment may include first trenches 521 and second trenches 522 which are alternately arrayed in a substrate 510. The semiconductor device 500 may further include active pillars 530 disposed between the first trenches 521 and the second trenches 522.

In some embodiments, the active pillars 530 may extend from the substrate 510. That is, the active pillars 530 and the substrate 510 may constitute a single unified body without any heterogeneous junction therebetween. In such a case, a pitch size and a height of the active pillars 530 may be defined by the first and second trenches 521 and 522 which are formed by partially removing the substrate 510.

The first and second trenches 521 and 522 may have uniform dimensions, and the active pillars 530 may also have uniform dimensions. For example, a depth of the first and second trenches 521 and 522 (corresponding to a height of the active pillars 530) may be within the range of about 2200 Å to about 3200 Å, and a width of the active pillars 530 may be within the range of about 14 nm to about 18 nm. Further, a width of the first and second trenches 521 and 522 (corresponding to spaces between the active pillars 530) may be within the range of about 13 nm to about 18 nm.

The first trenches 521 may be completely filled with a full filling insulation layer 540, while lower portions of the second trenches 522 between a bottom level H0 of the second trenches 522 and a first height level H1 on the bottom level H0 may be filled with a partial filling insulation layer 542. The full filling insulation layer 540 and the partial filling insulation layer 542 may be the same material. In some embodiments, the full filling insulation layer 540 and the partial filling insulation layer 542 may be a silicon oxide layer.

As such, lowermost regions 532 of the adjacent active pillars 530 may be insulated from each other by the partial filling insulation layer 542 or the full filling insulation layer 540. As described above, whereas the partial filling insulation layer 542 may fill only a portion of each of the second trenches 522, the full filling insulation layer 540 may completely fill the first trenches 521. Thus, in an embodiment where the width of the active pillars 530 is relatively low, the full filling insulation layer 540 may support the active pillars 530 to suppress a leaning phenomenon of the active pillars 530.

Portions of the active pillars 530 between the first height level H1 and a second height level H2 above the first height level H1 may correspond to metal silicide regions 534, and each of the metal silicide regions 534 may be filled with a metal silicide pattern 535. In some embodiments, each of the metal silicide patterns 535 may include a cobalt silicide (CoSi) layer. The metal silicide patterns 535 may be distributed from the first height level H1 to the second height level H2 in the active pillars 530. Thus, one sidewall of each metal silicide pattern 535 may be exposed by the second trench 522, and the opposite sidewall of each metal silicide pattern 535 may be in contact with the full filling insulation layer 540 filling the first trenches 521.

Each of the active pillars 530 may further include a transistor active region 536 disposed on the metal silicide region 534, and the transistor active region 536 may include a drain region 551 disposed in a lower portion thereof and a source region 552 disposed in an upper portion thereof. Although not indicated in the drawing, the transistor active region 536 may also include a channel region between the drain region 551 and the source region 552.

Capping insulation patterns 560 may be disposed on the active pillars 530. In some embodiments, the capping insulation patterns 560 may be silicon nitride patterns.

An insulation pattern 570 having a 'U'-shaped vertical cross section may be disposed in each of the second trenches 542, and a bottom surface of the 'U'-shaped insulation pattern 570 may be located at substantially the same level as the second height level H2. Thus, air gaps 580 may be provided in the second trenches 522 between sidewalls of the metal silicide patterns 535. Specifically, each of the insulation patterns 570 may include spacer-shaped sidewalls covering sidewalls of the adjacent transistor active regions 536 as well as sidewalls of the adjacent capping insulation patterns 560, and a base portion connecting lower ends of the spacer-shaped sidewalls to each other. Thus, the air gaps 580 may be provided between the base portions of the insulation patterns 570 and the partial filling insulation layer 542.

That is, each of the air gaps 580 may be surrounded by a top surface of the partial filling insulation layer 542, sidewalls of the pair of adjacent metal silicide patterns 535, and a bottom surface of the insulation pattern 570. Accordingly, the air gaps 580 may exist between the metal silicide patterns 535. As a result, a parasitic capacitance or a coupling capacitance between the adjacent metal silicide patterns 535 may be reduced because the air in the air gaps 580 has a lower dielectric constant than other insulation materials such as a silicon oxide material and a silicon nitride material. In some embodiments, each of the insulation patterns 570 may include a silicon oxide layer. In a semiconductor device 500 according to the present embodiment, the metal silicide patterns 535 may be used as buried bit lines.

Figure 6:
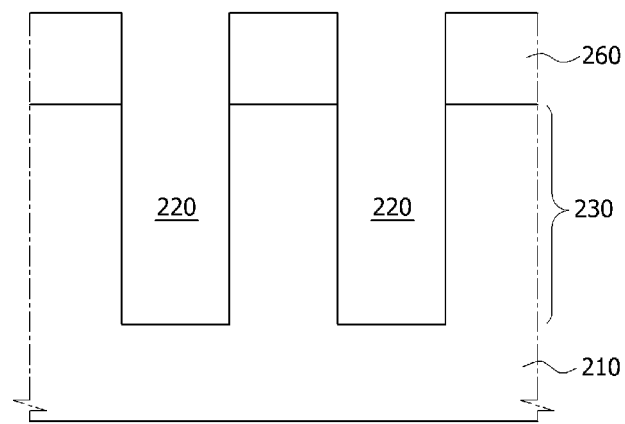
FIGS. 6 to 12 are cross sectional views illustrating a method of fabricating a semiconductor device according to an embodiment.

FIGS. 6 to 12 are cross sectional views illustrating a method of fabricating a semiconductor device according to an embodiment. Referring to FIG. 6, a plurality of capping insulation patterns 260 may be formed on a substrate 210 to expose portions of the substrate 210. The substrate 210 may be, for example, a silicon substrate. The capping insulation patterns 260 may be formed of a silicon nitride layer. The substrate 210 may be partially etched using the capping insulation patterns 260 as etch masks to form a plurality of trenches 220 which are uniformly spaced apart from each other.

The trenches 220 may define a plurality of active pillars 230 which are uniformly spaced apart from each other. That is, a width, a height and a volume of the active pillars 230 may be defined by the trenches 220 which are formed by partially removing the substrate 210. The trenches 220 may be formed to have uniform dimensions, and the active pillars 230 may also be formed to have uniform dimensions. For example, each of the trenches 220 may be formed to have a depth of about 2200 Å to about 3200 Å. The depth of the trenches 220 may correspond to a height of the active pillars 230.

Each of the active pillars 230 may be formed to have a width of about 14 nm to about 18 nm. In addition, each of the trenches 220 may be formed to have a width of about 13 nm to about 18 nm. The width of the trenches 220 may correspond to a space between the active pillars 230.

Figure 7:
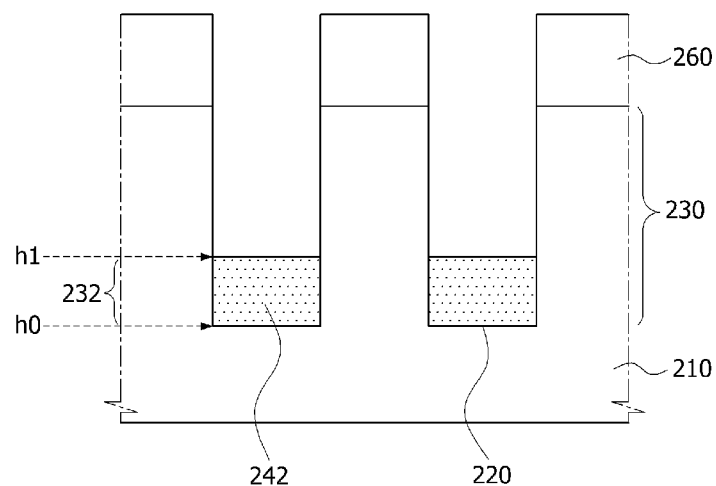

Referring to FIG. 7, a partial filling insulation layer 242 may be formed to fill lower portions in the trenches 220 between a bottom level H0 of the trenches 220 and a first height level H1 above the bottom level H0. In some embodiments, the partial filling insulation layer 242 may be formed of a silicon oxide layer. Specifically, a buried insulation layer may be formed to completely fill all the trenches 220. The buried insulation layer may then be planarized to expose top surfaces of the capping insulation patterns 260. Subsequently, a portion of the buried insulation layer may be recessed to form the partial filling insulation layer 242 whose top surface is located at substantially the same level as the first height level H1. After planarization of the buried insulation layer, a portion of the buried insulation layer may be recessed using a wet etch-back process. Lowermost regions 232 of the active pillars 230 may be defined by formation of the partial filling insulation layer 242. That is, the lowermost regions 232 of the active pillars 230 may be defined between the first height level H1 and the bottom level H0.

Figure 8:
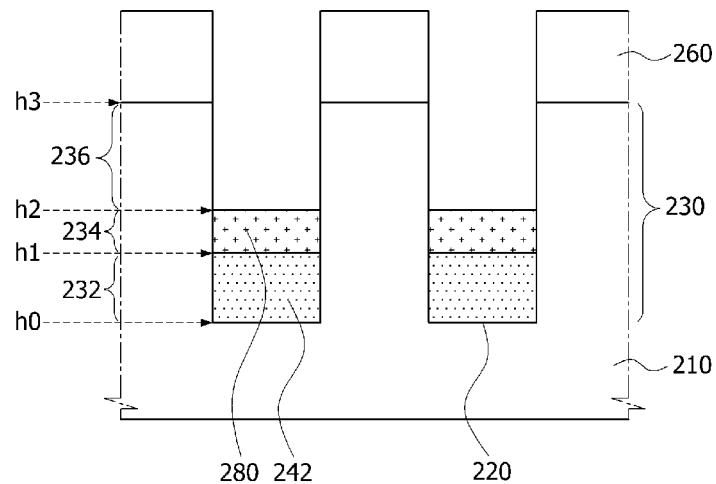

Referring to FIG. 8, a sacrificial layer 280 may be formed to fill the trenches 220 between the first height level H1 and a second height level H2 above the first height level H1. In some embodiments, the sacrificial layer 280 may be formed of a carbon layer or a photoresist layer. Specifically, a sacrificial material layer may be formed on the partial filling insulation layer 242 to completely fill all the trenches 220. The sacrificial material layer may then be planarized and recessed to form the sacrificial layer 280 whose top surface is located at substantially the same level as the second height level H2. The planarization and recession of the sacrificial material layer may be performed using an etch-back process.

Metal silicide regions 234 of the active pillars 230 may be defined by formation of the sacrificial layer 280. That is, the metal silicide regions 234 of the active pillars 230 may be defined between the first height level H1 and the second height level H2, which corresponds to the location of sacrificial layer 280. Portions of the active pillars 230 above the metal silicide regions 234 may be defined as transistor active regions 236. That is, the transistor active regions 236 may be defined in the active pillars 230 between the second height level H2 and a third height level H3 located at the same level as top surfaces of the active pillars 230.

Figure 9:
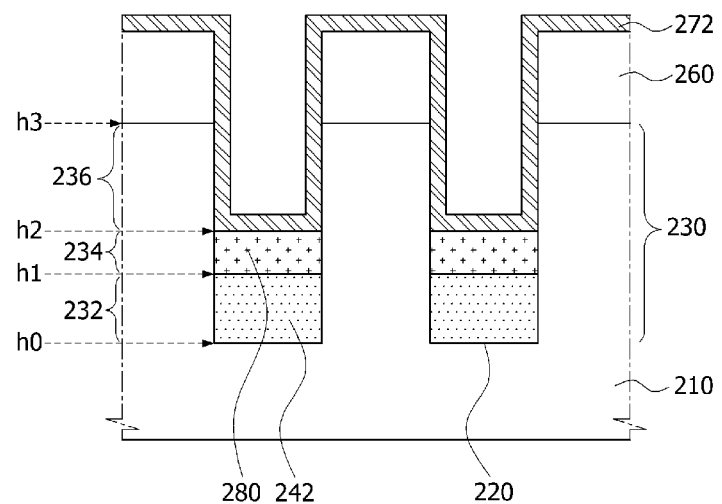
Figure 10:
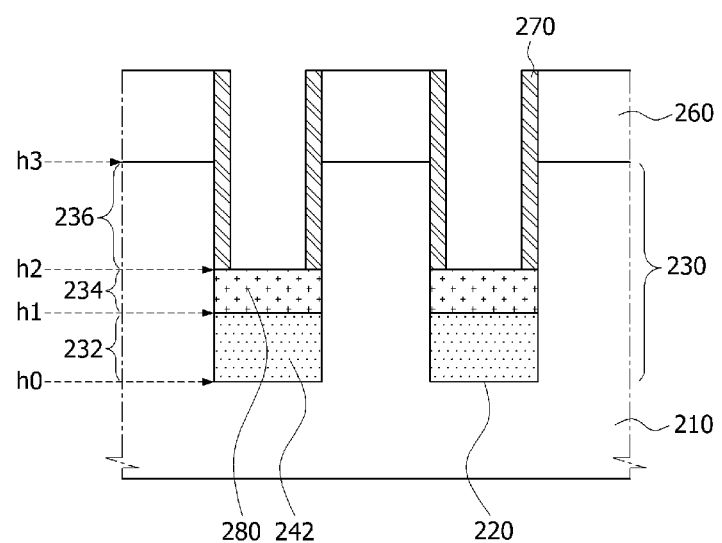

Referring to FIGS. 9 and 10, a spacer insulation layer 272 may be formed on an entire surface of the substrate including the sacrificial layer 280. The spacer insulation layer 272 may be conformally formed to have a uniform thickness on top surfaces and sidewalls of the capping insulation patterns 260, sidewalls of the transistor active regions 236, and a top surface of the sacrificial layer 280. In some embodiments, the spacer insulation layer 272 may be formed of a silicon oxide layer, for example, an ultra low temperature oxide (ULTO) layer.

The spacer insulation layer 272 may be etched back to expose the top surfaces of the capping insulation patterns 260 and the top surface of the sacrificial layer 280. As a result, spacers 270 may be formed on the sidewalls of the capping insulation patterns 260 and the sidewalls of the transistor active regions 236. That is, the spacers 270 may be formed between the second height level H2 and a top surface level of the capping insulation patterns 260. The top surface of the sacrificial layer 280 may be exposed in the trenches 220 after formation of the spacers 270.

Figure 11:
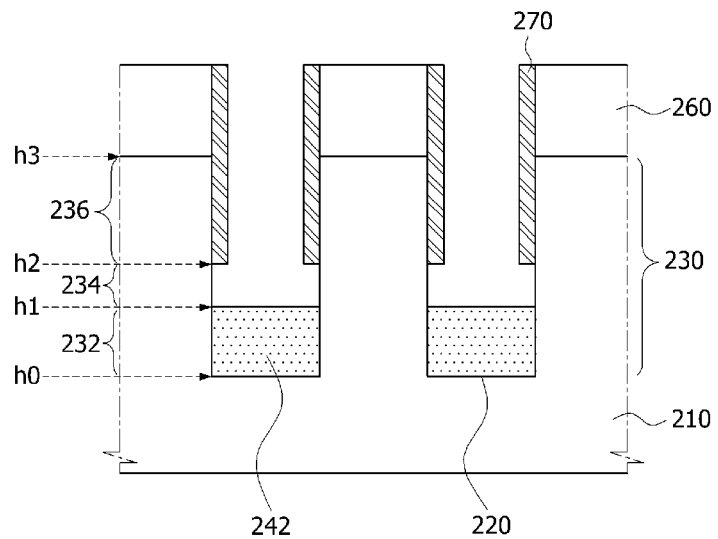

Referring to FIG. 11, the sacrificial layer 280 exposed by the spacers 270 may be removed. In an embodiment where the sacrificial layer 280 is formed of a carbon layer or a photoresist layer, the sacrificial layer 280 may be removed by an ashing process using an oxygen gas. After the sacrificial layer 280 is removed, sidewalls of the metal silicide regions 234 between the first and second height levels H1 and H2 may be exposed in the trenches 220. In contrast, the sidewalls of the lowermost regions 232 may be covered with the partial filling insulation layer 242, and the sidewalls of the transistor active regions 236 may be covered by the spacers 270.

Figure 12:
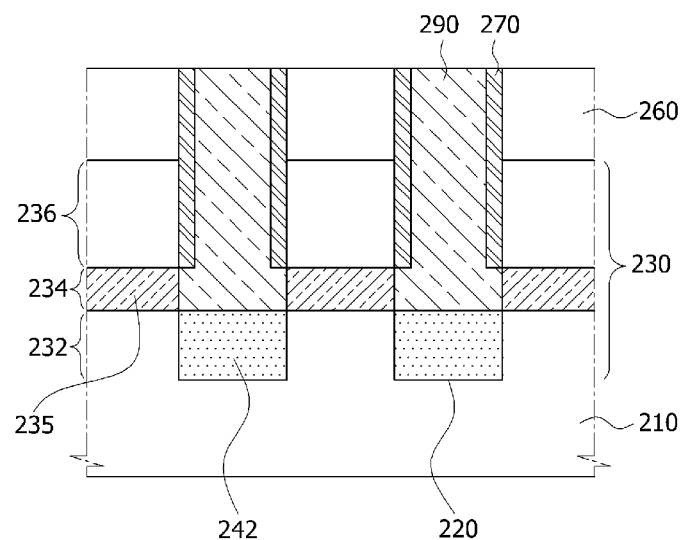

Referring to FIG. 12, a metal layer 290 may be formed in the trenches 220. The metal layer 290 may be formed of a cobalt (Co) layer. The metal layer 290 may be formed to directly contact the sidewalls of the metal silicide regions 234 of the active pillars 230, and the other regions of the active pillars 230 may be separated from the metal layer 290 by the spacers 270 and the partial filling insulation layer 242. Subsequently, a thermal treatment process may be applied to the substrate including the metal layer 290 to perform silicidation of the metal silicide regions 234. As a result, metal silicide patterns 235 may be formed in the metal silicide regions 234. After the metal silicide patterns 235 are formed, the remaining metal layer 290 may be removed.

Figure 13:
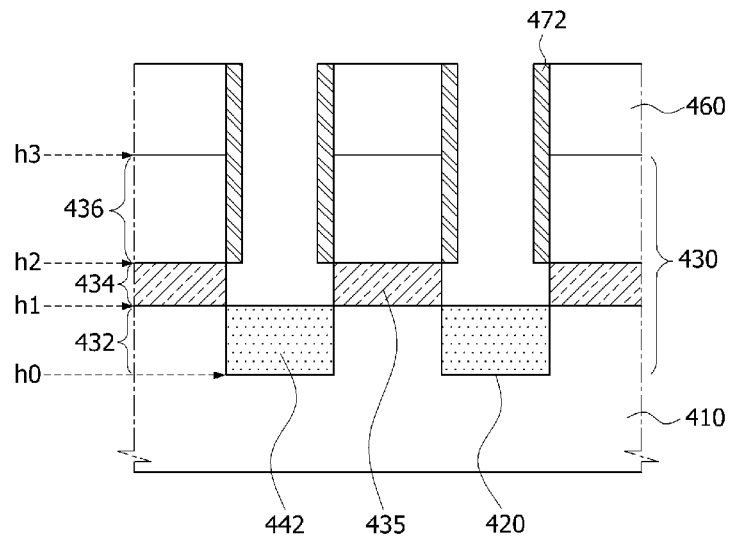
FIGS. 13, 14 and 15 are cross sectional views illustrating a method of fabricating a semiconductor device according to another embodiment.
Figure 14:
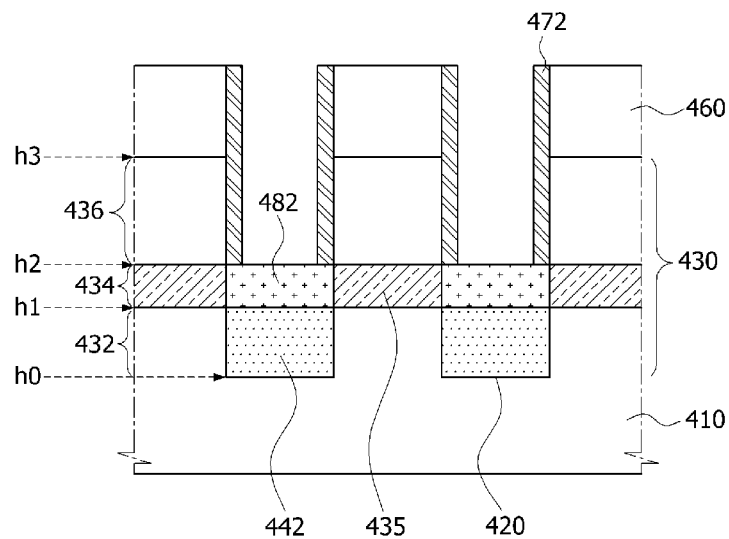
Figure 15:
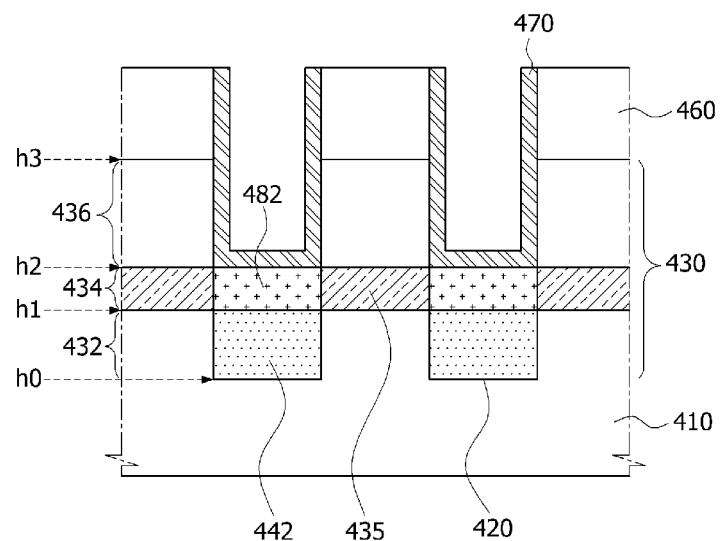

FIGS. 13, 14 and 15 are cross sectional views illustrating a method of fabricating a semiconductor device according to another embodiment. The present embodiment will be described in conjunction with a method of fabricating a semiconductor device including the air gaps 480 illustrated in FIG. 4.

First, the same processes as described with reference to FIGS. 6 to 12 may be performed to obtain a resultant illustrated in FIG. 13. As a result, trenches 420 may be formed in a substrate 410 to define active pillars 430 that vertically extend from the substrate 410, and each of the active pillars 430 may be formed to include a lowermost region 432, a metal silicide region 434 and a transistor active region 436 which are sequentially stacked. The lowermost region 432 may be defined between a bottom level H0 of the trenches 420 and a first height level H1 above the bottom level H0, the metal silicide region 434 may be defined between the first height level H1 and a second height level H2 above the first height level H1, and the transistor active region 436 may be defined between the second height level H2 and a third height level H3 above the second height level H2.

Further, a partial filling insulation layer 442 may be formed to fill lowermost regions in the trenches 420, and spacers 472 may be formed on sidewalls of transistor active regions 436 and sidewalls of capping insulation patterns 460 stacked on the active pillars 430. Metal silicide patterns 435 may be formed in the metal silicide regions 434, and sidewalls of the metal silicide patterns 435 may be exposed in the trenches 420.

As illustrated in FIG. 14, a sacrificial layer 482 may be formed on the partial filling insulation layer 442. The sacrificial layer 482 may be formed to have the same thickness as the metal silicide patterns 435. Thus, after the sacrificial layer 482 is formed, sidewalls of the metal silicide patterns 435 may be in direct contact with the sacrificial layer 482. In some embodiments, the sacrificial layer 482 may be formed of a carbon layer or a photoresist layer. The sacrificial layer 482 may be formed by depositing a sacrificial material layer on an entire surface of the substrate including the exposed metal silicide patterns 435 to fill the trenches 420 and by removing upper portions of the sacrificial material layer with an etchback process.

As illustrated in FIG. 15, insulation patterns 470 may then be formed on the sacrificial layer 482 in the trenches 420. The insulation patterns 470 may be formed of the same material layer, for example, a silicon oxide layer as the spacers 472 illustrated in FIG. 14. In more detail, the insulation patterns 470 may be formed of an ultra low temperature oxide (ULTO) layer. The insulation patterns 470 may be formed to conformally cover sidewalls of the capping insulation patterns 460, sidewalls of the transistor active regions 436, and a top surface of the sacrificial layer 482.

After the insulation patterns 470 are formed, the sacrificial layer 482 under the insulation patterns 470 may be removed to form the air gaps 480 illustrated in FIG. 4. In an embodiment in which the sacrificial layer 482 is formed of a carbon layer or a photoresist layer, the sacrificial layer 482 may be removed by an ashing process using an oxygen gas. Although not shown in the drawings, portions of the insulation patterns 470 may be etched to expose a portion of the sacrificial layer 482 before the sacrificial layer 482 is removed.

FIGS. 16 to 23 are cross sectional views illustrating a method of fabricating a semiconductor device according to still another embodiment. The present embodiment will be described in conjunction with a method of fabricating a semiconductor device having a structure in which one of a pair of adjacent trenches is completely filled with a single insulation layer, as illustrated in FIG. 3.

Figure 16:
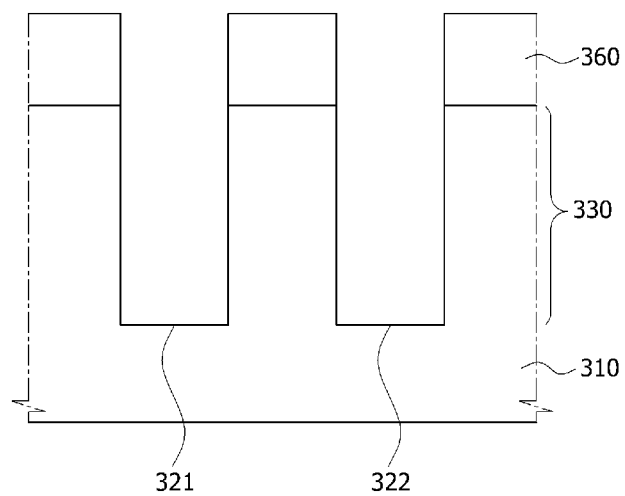
FIGS. 16 to 23 are cross sectional views illustrating a method of fabricating a semiconductor device according to still another embodiment.

Referring to FIG. 16, a plurality of capping insulation patterns patterns 360 may be formed on a substrate 310 to expose portions of the substrate 310. The substrate 310 may be, for example, a silicon substrate. The capping insulation patterns 360 may be formed of a silicon nitride layer. The substrate 310 may be partially etched using the capping insulation patterns 360 as etch masks to form first trenches 321 and second trenches 322 which are alternately arrayed in the substrate 310 and uniformly spaced apart from each other.

The first and second trenches 321 and 322 may define a plurality of active pillars 330 disposed therebetween. A width, a height and a volume of the active pillars 330 may be defined by the first and second trenches 321 and 322 which are formed by removing portions of the substrate 310. The first and second trenches 321 and 322 may be formed to have uniform dimensions, and the active pillars 330 may also be formed to have uniform dimensions. For example, each of the first and second trenches 321 and 322 may be formed to have a depth of about 2200 Å to about 3200 Å.

The depth of the first and second trenches 321 and 322 may correspond to a height of the active pillars 330. Further, each of the active pillars 330 may be formed to have a width of about 14 nm to about 18 nm. In addition, each of the first and second trenches 321 and 322 may be formed to have a width of about 13 nm to about 18 nm. The width of the first and second trenches 321 and 322 may correspond to a space between the active pillars 330.

Figure 17:
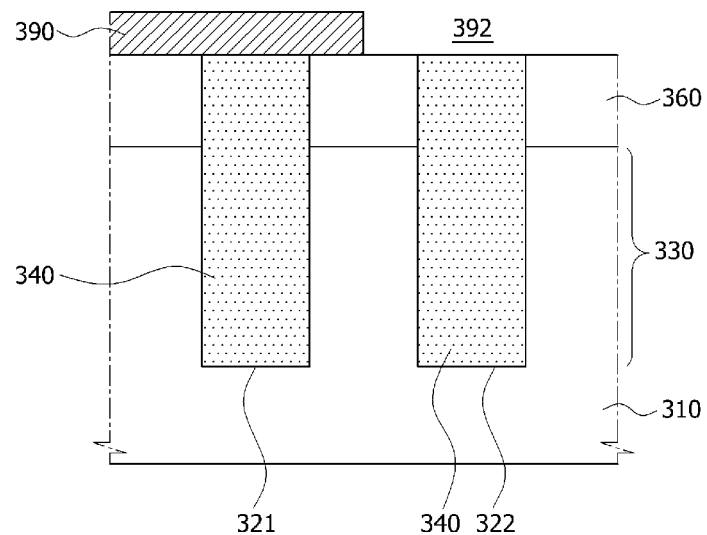

Referring to FIG. 17, after the first and second trenches 321 and 322 are formed, a full filling insulation layer 340 may be formed to completely fill the first and second trenches 321 and 322. In some embodiments, the full filling insulation layer 340 may be formed of a silicon oxide layer, for example, a ULTO layer. The full filling insulation layer 340 may be formed by depositing an insulation layer on an entire surface of the substrate including the trenches 321 and 322 and by planarizing the insulation layer to expose top surfaces of the capping insulation patterns 360.

After formation of the full filling insulation layer 340, a mask pattern 390 may be formed on the substrate having the full filling insulation layer 340. The mask pattern 390 may be formed to cover the full filling insulation layer 340 in first trenches 321 and to have openings 392 that expose the full filling insulation layer 340 in second trenches 322. The mask pattern 390 may be formed of a material layer having an etch selectivity with respect to the capping insulation patterns 360 and the full filling insulation layer 340. For example, when the capping insulation patterns 360 are formed of a silicon nitride layer and the full filling insulation layer 340 is formed of a silicon oxide layer, the mask pattern 390 may be formed of a polysilicon layer.

Figure 18:
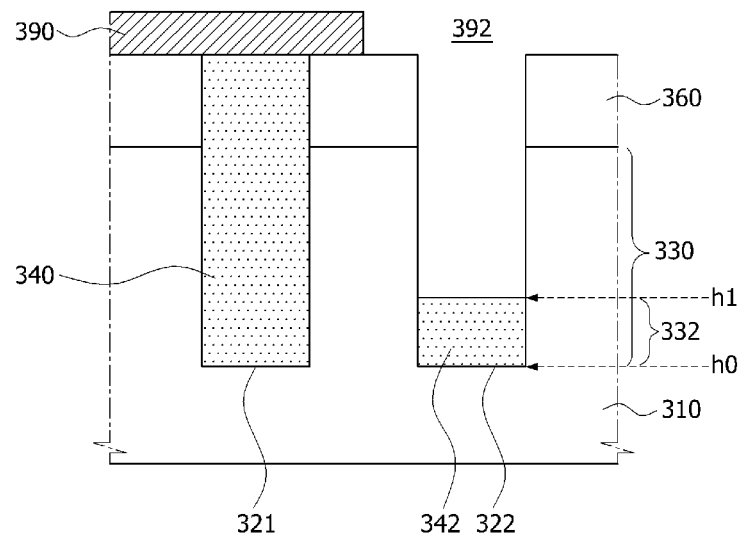

Referring to FIG. 18, the full filling insulation layer 340 in the second trenches 322 may be selectively etched back using the mask pattern 390 as an etch mask, thereby forming a partial filling insulation layer 342 that remains in the second trenches 322 between a bottom level H0 of the second trenches 322 and a first height level H1 above the bottom level H0. As a result, lowermost regions 332 of the active pillars 330 may be defined by formation of the partial filling insulation layer 342. That is, the lowermost regions 332 of the active pillars 330 may be defined between the bottom level H0 of the second trenches 322 and the first height level H1 coplanar with a top surface of the partial filling insulation layer 342.

The full filling insulation layer 340 in the second trenches 322 may be selectively etched back using a wet etch-back process. As a result, the first trenches 321 may be completely filled with the full filling insulation layer 340, and the second trenches 322 may be partially filled with the partial filling insulation layer 342. After the partial filling insulation layer 342 is formed, the mask pattern 390 may be removed.

Figure 19:
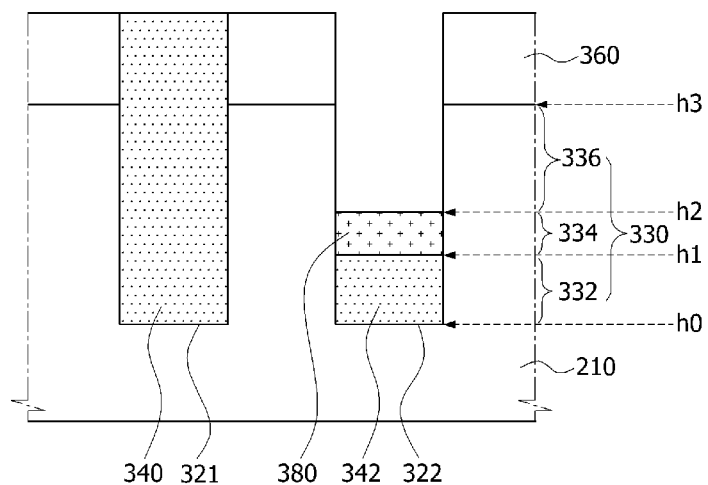

Referring to FIG. 19, a sacrificial layer 380 may be formed in the second trenches 322 between the first height level H1 and a second height level H2 above the first height level H1. In some embodiments, the sacrificial layer 380 may be formed of a carbon layer or a photoresist layer. Specifically, a sacrificial material layer may be formed to completely fill all the second trenches 322 on the partial filling insulation layer 342. The sacrificial material layer may then be planarized and recessed to form the sacrificial layer 380 whose top surface is located at substantially the same level as the second height level H2. The planarizing and recessing the sacrificial material layer may be performed using an etch-back process.

Metal silicide regions 334 of the active pillars 330 may be defined by formation of the sacrificial layer 380. That is, the metal silicide regions 334 of the active pillars 330 may be defined between the first height level H1 and the second height level H2. The active pillars 330 on the metal silicide regions 334 may be defined as transistor active regions 336. That is, the transistor active regions 336 may be defined in the active pillars 330 between the second height level H2 and a third height level H3 located at the same level as top surfaces of the active pillars 330.

Figure 20:
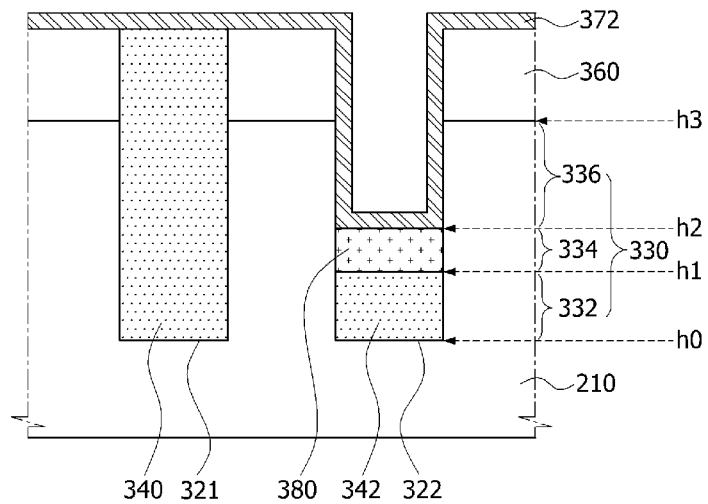

Referring to FIG. 20, a spacer insulation layer 372 may be formed on an entire surface of the substrate including the sacrificial layer 380. The spacer insulation layer 372 may be conformally formed to uniformly cover top surfaces of the capping insulation patterns 360 and the full filling insulation layer 340, sidewalls of the transistor active regions 336 and the capping insulation patterns 360 exposed in the second trenches 322, and a top surface of the sacrificial layer 380. In some embodiments, the spacer insulation layer 372 may be formed of a silicon oxide layer, for example, an ultra low temperature oxide (ULTO) layer.

Figure 21:
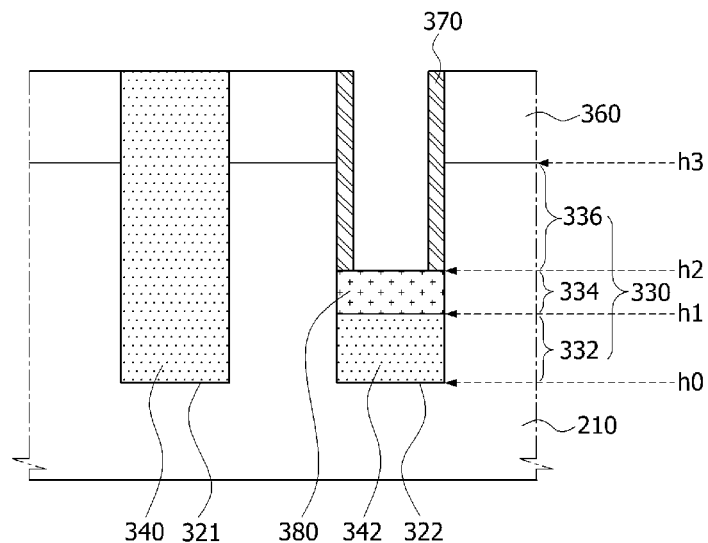

Referring to FIG. 21, the spacer insulation layer 372 may be etched back to expose the top surfaces of the capping insulation patterns 360, the top surface of the full filling insulation layer 340 and the top surface of the sacrificial layer 380. As a result, spacers 370 may be formed on the sidewalls of the capping insulation patterns 360 and the sidewalls of the transistor active regions 336 which are exposed by the second trenches 322. That is, the spacers 370 may be formed to cover sidewalls of the second trenches 322 above the sacrificial layer 380.

Figure 22:
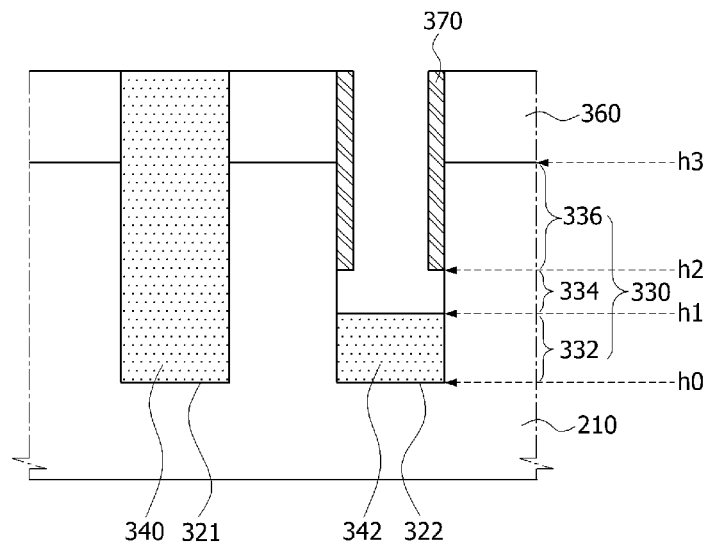

Referring to FIG. 22, the sacrificial layer 380 exposed by the spacers 370 may be removed. In an embodiment where the sacrificial layer 380 is formed of a carbon layer or a photoresist layer, the sacrificial layer 380 may be removed by an ashing process using an oxygen gas. After the sacrificial layer 380 is removed, sidewalls of the metal silicide regions 334 between the first and second height levels H1 and H2 may be exposed in the second trenches 322. In contrast, the sidewalls of the lowermost regions 332 of the active pillars 330 may be still covered with the partial filling insulation layer 342, and the sidewalls of the transistor active regions 336 may be still covered with the spacers 370.

Figure 23:
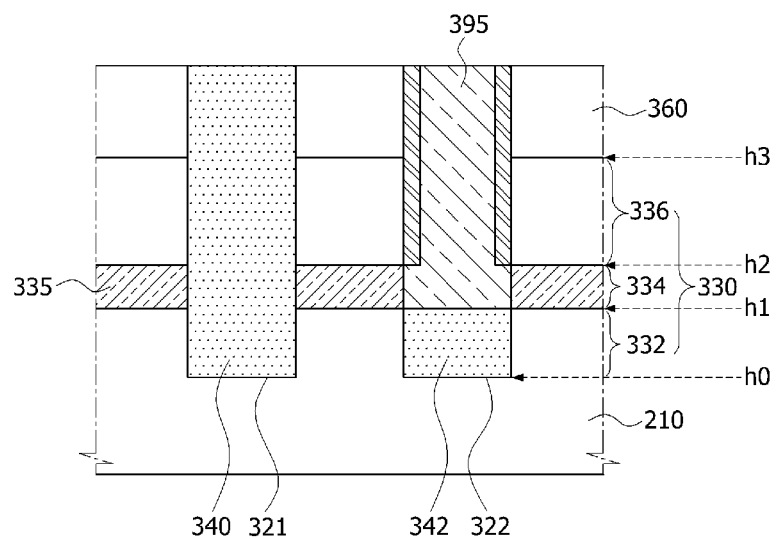

Referring to FIG. 23, a metal layer 395 may be formed in the second trenches 322. The metal layer 395 may be formed of a cobalt (Co) layer. The metal layer 395 may be formed to directly contact the sidewalls of the metal silicide regions 334 of the active pillars 330, and the other regions of the active pillars 330 may be separated from the metal layer 395 by the spacers 370 and the partial filling insulation layer 342.

Subsequently, a thermal treatment process may be applied to the substrate including the metal layer 395 to perform silicidation of the metal silicide regions 334. As a result, metal silicide patterns 335 may be formed in the metal silicide regions 334. After the metal silicide patterns 335 are formed, the remaining metal layer 395 may be removed.

Figure 24:
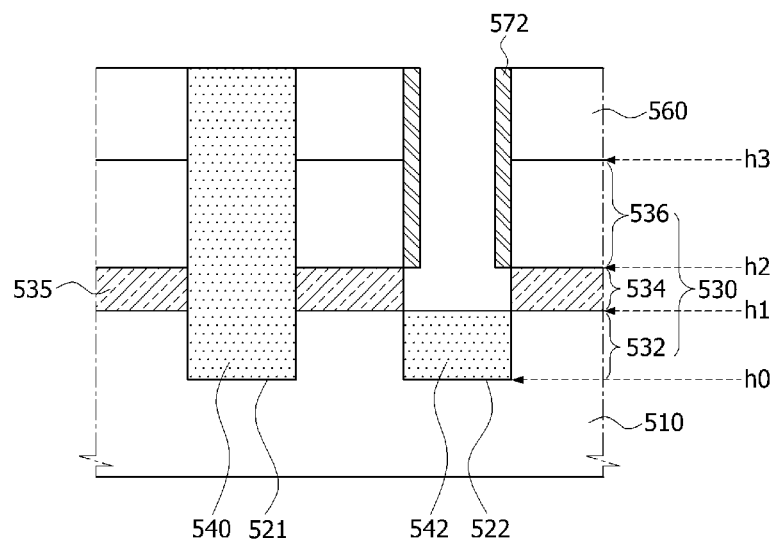
FIGS. 24, 25 and 26 are cross sectional views illustrating a method of fabricating a semiconductor device according to yet another embodiment.
Figure 25:
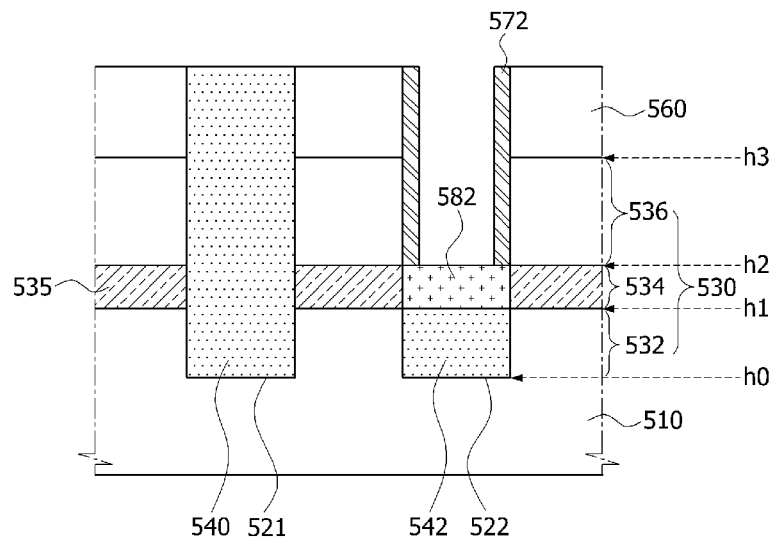
Figure 26:
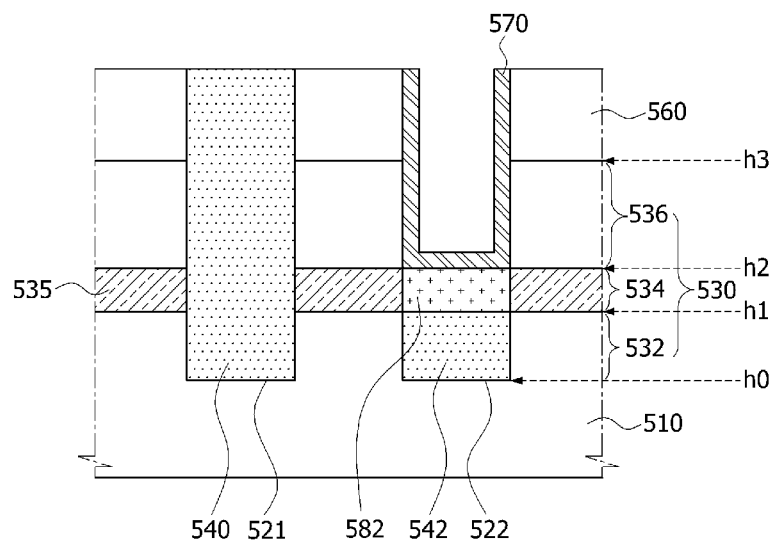

FIGS. 24, 25 and 26 are cross sectional views illustrating a method of fabricating a semiconductor device according to yet another embodiment. The present embodiment will be described in conjunction with a method of fabricating a semiconductor device having a structure in which one of a pair of adjacent trenches is completely filled with a single insulation layer and the other of the pair of adjacent trenches includes an air gap therein, as illustrated in FIG. 5.

First, the same processes as described with reference to FIGS. 16 to 23 may be performed to obtain the structure illustrated in FIG. 24. As a result, first trenches 521 and second trenches 522, which are alternately arrayed, may be formed in a substrate 510 to define active pillars 530 that vertically extend from the substrate 510, and each of the active pillars 530 may be formed to include a lowermost region 532, a metal silicide region 534 and a transistor active region 536 which are sequentially stacked. The lowermost region 532 may be defined between a bottom level H0 of the first and second trenches 521 and 522 and a first height level H1 above the bottom level H0, the metal silicide region 534 may be defined between the first height level H1 and a second height level H2 above the first height level H1, and the transistor active region 536 may be defined between the second height level H2 and a third height level H3 above the second height level H2.

While the first trenches 521 are completely filled with a full filling insulation layer 540, the second trenches 522 may be partially filled with a partial filling insulation layer 542. Specifically, the partial filling insulation layer 542 may be buried in the second trenches 522 between the bottom level H0 and the first height level H1. Thus, one sidewall of the lowermost region 532 of the active pillar 530 may be covered with the full filling insulation layer 540 in the first trench 521, and the other sidewall of the lowermost region 532 of the active pillar 530 may be covered with the partial filling insulation layer 542 in the second trench 522.

Metal silicide patterns 535 may be formed in the metal silicide regions 534 of the active pillars 530. Further, spacers 572 may be formed on sidewalls of the transistor active regions 536 and sidewalls of the capping insulation patterns 560 stacked on the active pillars 530. Accordingly, sidewalls of the metal silicide patterns 535 may be exposed in the second trenches 522.

As illustrated in FIG. 25, a sacrificial layer 582 may be formed on the partial filling insulation layer 542 in the second trenches 522. The sacrificial layer 582 may be formed to have the same thickness as the metal silicide patterns 535. Thus, after the sacrificial layer 582 is formed, sidewalls of the metal silicide patterns 535 may be in direct contact with the sacrificial layer 582 in the second trenches 522 and sidewalls of the metal silicide patterns 535 may be in direct contact with the full filling insulation layer 540 in the first trenches 521. In some embodiments, the sacrificial layer 582 may be formed of a carbon layer or a photoresist layer. The sacrificial layer 582 may be formed by depositing a sacrificial material layer on an entire surface of the substrate including the exposed metal silicide patterns 535 to fill the second trenches 522, and by recessing the sacrificial material layer with an etch-back process.

As illustrated in FIG. 26, insulation patterns 570 may then be formed in respective ones of the second trenches 522 on the sacrificial layer 582. The insulation patterns 570 may be formed of the same material layer, for example, a silicon oxide layer, as the spacers 572 illustrated in FIG. 25. In more detail, the insulation patterns 570 may be formed of an ultra low temperature oxide (ULTO) layer. The insulation patterns 570 may be formed in the second trenches 522 to conformally cover sidewalls of the capping insulation patterns 560, sidewalls of the transistor active regions 536, and a top surface of the sacrificial layer 582.

After the insulation patterns 570 are formed, the sacrificial layer 582 under the insulation layer 570 may be removed to form the air gaps 580 illustrated in FIG. 5. In an embodiment in which the sacrificial layer 582 is formed of a carbon layer or a photoresist layer, the sacrificial layer 582 may be removed by an ashing process using an oxygen gas. Although not shown in the drawings, portions of the insulation patterns 570 may be etched to expose a portion of the sacrificial layer 582 before the sacrificial layer 582 is removed.

According to the embodiments set forth above, semiconductor devices including buried metal silicide patterns may be fabricated using simple processes even though the semiconductor devices are scaled down to increase the integration density thereof.

The above embodiments have been disclosed above for illustrative purposes. Those skilled in the art will appreciate that various modifications, additions and substitutions are possible, without departing from the scope and spirit of the inventive concepts disclosed in the accompanying claims.

What is claimed is:

1. A semiconductor device comprising:
a substrate; and
a plurality of active pillars disposed on the substrate and spaced apart from each other by first trenches and second trenches which are alternately arrayed, each of the active pillars including an active region stacked on a buried metal silicide pattern;
a filling insulation layer that fills the first trenches; and a partial insulation layer disposed in the second trenches and having an upper surface that is level with bottom surfaces of the buried metal silicide patterns;
capping insulation patterns disposed on the plurality of active pillars;
spacers disposed on sidewalls of the capping insulation patterns, the spacers extending onto sidewalls of the transistor active regions of the second trenches under the capping insulation patterns, wherein lower surfaces of the spacers are level with upper surfaces of the buried metal silicide patterns; and
a lower insulation pattern extending between spacers on sidewalls and defining an air gap between the partial insulation layer and the lower insulation pattern.

2. The semiconductor device of claim 1, wherein the partial insulation layer includes a silicon oxide layer.

3. The semiconductor device of claim 1, wherein the capping insulation patterns include a silicon nitride layer.

4. The semiconductor device of claim 1, wherein the buried metal silicide patterns include a cobalt silicide layer.

5. The semiconductor device of claim 1, wherein the impurity junction regions in the active region include an upper impurity region disposed in an upper portion of the active region and a lower impurity region disposed in a lower portion of the active region.

* * * * *